United States Patent [19]

Falconer et al.

[11] Patent Number: 4,921,740

[45] Date of Patent: May 1, 1990

[54] MASKING FILMS

[75] Inventors: Stuart A. Falconer, Oxon; David J. Foster, Swindon; John Steel, Wantage, all of England

[73] Assignee: Autotype International Limited, Wantage, Oxfordshire, United Kingdom

[21] Appl. No.: 293,328

[22] Filed: Jan. 5, 1989

[51] Int. Cl.[5] .......................... B32B 7/06; B32B 7/12
[52] U.S. Cl. .................................. 428/40; 428/425.1; 118/504; 118/505
[58] Field of Search ............... 428/40, 425.1; 118/504, 118/505

[56] References Cited

U.S. PATENT DOCUMENTS 3,892,900  7/1975  Shima et al. ........................... 428/40
4,681,784  7/1987  Ebara et al. ........................... 428/40

*Primary Examiner*—Alexander S. Thomas
*Attorney, Agent, or Firm*—Marjama & Pincelli

[57] ABSTRACT

Masking films, having the advantageous properties of both those masking films having an intermediate adhesive layer and those masking films having a high-adhesion masking layer without an intermediate adhesive layer, include a masking layer which incorporates a cellulose ester component, a polyurethane and one or more colorants selected from dyes and pigments.

10 Claims, No Drawings

MASKING FILMS

This invention relates to masking films, that is laminated sheet products of the kind comprising a stable transparent base, such as a base film, carrying a masking layer, i.e. a coloured membrane in the form of a synthetic resin layer or coating which may be cut through and peeled away from the base. The masking layer or coating is heavily pigmented or dyed, so that it has a high photographic density to actinic light, but it also has good visual transparency. By cutting through the masking layer or coating and peeling parts of it away from the base, the product can be used as a photographic mask. Alternatively, the coating can be imagewise cut and stripped away, so that it can then form the original for further processing, e.g. in the preparation of lithoplates or screen-printing stencils. Masking films of this general type are widely used for these and other applications in the printing industry.

In general, there are two types of masking film. Type 1 has a thin intermediate layer of an adhesive interposed between the coloured membrane and the base. This intermediate layer enhances the stripping properties and its adhesiveness is capable of adjustment so as to confer restick properties on the stripped membrane. Synthetic resins or polymers previously used as membranes in Type 1 masking films including heavily-plasticised nitrocellulose, polyurethane-cellulose acetate mixtures and polyvinylchloride. Generally, coatings made from these resins do not give films with very high tensile strengths.

Type 2 has been introduced more recently and dispenses with the intermediate adhesive layer. The synthetic resin layer is coated directly on to the support or film base and is adjusted so that its adhesion to the base film is considerably increased. This type finds use where high adhesion is very important, such as in the cutting of very fine lines, and is of particular application in computer-aided cutting equipment, where very complex patterns may be required. Our co-pending Application EP-168924-A2 describes such a product. The membrane can be made to have a high tensile strength. However, one effect of coating the masking film layer of a Type 2 product directly on to the film base is that, depending upon the type of film base being coated, the adhesion properties vary and cannot easily be controlled. Polyester is commonly used, because of its dimensional stability, but the adhesion/release properties of a membrane coated directly on to such a film surface depend upon the grade, type and source of film used, and can even be subject to batch-to-batch variations in the film base. A further important general property of masking films is the extent to which overcutting can cause the layer to reseal; any overcuts which do not become resealed show up in the subsequent exposure sequence. The very high adhesion of the membrane to the base in Type 2 products precludes the resealing of overcuts, although the properties of the adhesive layer and of the membrane or masking layer in Type 1 products can easily be adjusted to accommodate this. It is therefore very desirable to find a way to combine the reseal, restick and general adhesion properties of the Type 1 product with the improved membrane strength of the Type 2 product. This invention is based upon our discovery of how this can be achieved.

According to the present invention, a light-screening masking film comprising a transparent support film or base and a masking layer removably attached to the base by means of an intermediate layer of adhesive is characterised in that the masking layer comprises:
  (a) a cellulose ester component,
  (b) an aliphatic polyester-based urethane and
  (c) one or more colourants selected from dyes and pigments.

Preferably, the cellulose ester component (a) is selected from cellulose nitrate, cellulose acetate propionate, cellulose acetate butyrate and mixtures thereof. It has been discovered that this combination of the components (a), (b) and (c) as defined above gives a masking layer having the advantages of both the Type 1 and Type 2 products. The polyurethane (b) confers upon the membrane exceptional elasticity, flexibility and tear-resistance. The resultant membrane is up to an order of difference stronger than those of the known plasticised nitrocellulose type, whilst still maintaining the desired cut-resealing properties. The peel properties are capable of adjustment over a desired range, by suitable modification or selection of the adhesive used as the interlayer, and the adhesiveness can be made relatively high when use of the product for complex designs is envisaged. The improved properties of the membrane enable it to be coated relatively thinly, thus assisting more accurate cutting for complex work, and the very high tear-resistance enables the unwanted portions of the membrane to be peeled from the base without continually breaking.

Preferably, the masking layer includes a grade of cellulose nitrate which contains 11.0 to 12.2% by b.w. nitrogen and has a viscosity of 0.25 to 0.5 second. The cellulose acetate propionate desirably has about 2.5% acetylation and about 45% propionation. Most preferably, it also has a melting-point in the range from 185° to 210° C. and a viscosity in the range from 0.2 to 0.5 second. The cellulose acetate butyrate preferably has about 13% acetylation and about 38% butylation. Most desirably, it also has a melting point in the range from 155° to 165° C. and a viscosity in the range from 0.1 to 0.5 second. The preferred viscosity ranges mentioned above in relation to specific materials, usable as or in the cellulose ester component (a), are as measured by the ASTM D817 (Formula A) Method.

The polyurethane component (b) can be any aliphatic polyester-based polyurethane and desirably and preferably is present in an amount in the range from 30% to 80% by weight of the total resin mix.

The pressure-sensitive adhesive layer can comprise a synthetic resin adhesive or a natural rubber adhesive or a mixture of such adhesives. Also, this layer may have its adhesiveness modified by the inclusion of tackifiers such as α-terpene resins.

In order that the invention can be more fully understood and appreciated, the following specific examples are given, which are intended to illustrate specific and preferred embodiments of the invention in a non-limitative manner. In the examples, the various amounts given are in parts by weight. Part A of Example 1 describes the preparation of a sub-coat formulation which is applied in known manner to a stable transparent film base and which consists of the adhesive intermediate layer referred to above and located in the masking film between the transparent base and the masking layer. Part B of Example 1 and each of Examples 2 and 3 describe the ingredients and preparation of a masking layer as such which is then coated over the sub-coat in order to produce the desired masking film.

EXAMPLE 1

Part A-Sub-Coat Formula

| | |
|---|---|
| Natural rubber (12% solution in toluene) | 100.0 |
| Tackifier e.g. alphaterpene resin* | 100.0 |
| Anti-oxidant e.g. Anti-oxidant 2246 (Registered Trade Mark) obtainable from Anchor Chemicals Limited | 35.0 |
| Toluene | 4700.0 |

*E.g. HYIS10 (Registered Trade Mark - Physolene Limited)

The ingredients were combined and mixed to produce a coating composition of the desired properties, which was then applied as an even layer to a stable transparent film base, as the first step in the manufacture of the desired masking film.

B-Masking Layer Formulation

| | |
|---|---|
| Aliphatic polyurethane, e.g. Permuthane U6366 (Registered Trade Mark) obtainable from Stahl Chemical Industries BV | 70.0 |
| Cellulose nitrate | 30.0 |
| Savinyl Fire Red 3 GLS (Savinyl is a Registered Trade Mark - Sandoz Limited) | 6.0 |
| Lampronol Light Orange R (Lampronol is a Registered Trade Mark - ICI) | 1.4 |
| Silica e.g. of the type OK412 (Registered Trade Mark) obtainable from Degussa | 1.4 |
| | 4.0 |
| Antistatic agent e.g. Crodafos 810D (Crodafos is a Registered Trade Mark of Croda Chemicals Limited) | 3.0 |
| Solvent Blend | 300.0 |

The above ingredients were admixed and formed into a homogeneous composition which was then coated on to the sub-coat side of the adhesively-coated transparent film base, to a thickness of 30 microns ($30 \times 10^{-3}$ mm).

EXAMPLE 2

MASKING LAYER FORMULATION

The following ingredients were admixed into a homogeneous composition which was then coated on to the subbed polyester film of Example 1 Part A to a coated thickness of 30 microns ($30 \times 10^{-3}$ mm) as in Example 1:

| | |
|---|---|
| Ethylene Vinyl Acetate e.g. Levapren 452 (Registered Trade Mark - Bayer) | 54.0 |
| Cellulose Nitrate | 46.0 |
| Savinyl Fire Red 3GLS | 5.1 |
| Lampronol Light Orange R | 0.9 |
| Silica e.g. ED40 (Registered Trade Mark of W R Grace Ltd) | 1.8 |
| Antistatic agent e.g. Statexan K1 (Registered Trade Mark Bayer UK) | 2.0 |
| Solvent blend | 310.0 |

EXAMPLE 3

MASKING LAYER FORMULATION

The following ingredients were admixed into a homogeneous composition which was then coated on to the subbed polyester film of Example 1 Part A to a coated thickness of 30 microns ($30 \times 10^{-3}$ mm) as in Example 1:

| | |
|---|---|
| Di Octyl Phthalte | 40.0 |
| Cellulose nitrate | 100.0 |
| Silica e.g. as in Example 2 | 3.0 |
| Antistatic agent e.g. lithium chloride | 0.7 |
| Savinyl Fire Red 3GLS | 6.0 |
| Lampronol Light Orange R | 1.1 |

In this example, the masking layer formulation was made up into a homogeneous composition which was then coated in a known manner on to the subbed polyester film to a coating thickness of 40 microns ($40 \times 10^{-4}$ mm).

In the above examples, various solvent blends were used. These were as follows:

| Example 1B | | Example 2 | | Example 3 | |
|---|---|---|---|---|---|
| MEK | 60 | MEK | 43 | MEK | 87 |
| IPA | 15 | Toluene | 40 | IPA | 13 |
| Toluene | 20 | IPA | 12 | | |
| Methyl Glycol | 5 | SBP 60-95 | 5 | | |

The polyester base used in the above examples is for instance sheet material having a thickness in the range from 0.002" to 0.007" (0.050 to 0.178 mm) such as the products obtainable under the Registered Trade Marks "Milar D" (Du Pont) or "Melinex OD" (ICI).

In order to evaluate the tensile yield strength, extension at break, ultimate tensile strength and tear resistance of the masking films according to the above examples, measurements were carried out using $3 \times 10$ cm samples on a tensiometer, tear resistance being measured by taking a $3 \times 30$ cm sample, slitting it along its long axis to 10 cm length and then measuring the force needed to separate the sample again using a tensiometer. The following results were obtained.

TABLE

| Example | | 1B | 2 | 3 |
|---|---|---|---|---|
| Tensile Yield Strength | $kgcm^{-2}$ | 130 | 220 | 125 |
| Extension at break | % | 250 | 80 | 30 |
| Ultimate Tensile Strength | $kgcm^{-2}$ | 190 | 300 | 140 |
| Tear resistance | g | 150 | 5 | 5 |

The results clearly show that there is a substantial improvement in membrane tear properties. An increase in tear resistance of 20 to 30 times that of known masking films is typically provided by the improved masking films according to the invention.

What is claimed is:

1. A masking film comprising a transparent base and a masking layer removably attached to the base by means of an intermediate layer of adhesive, characterised in that the masking layer comprises:
    (a) a cellulose ester component,
    (b) an aliphatic polyester-based polyurethane and
    (c) one or more colourants selected from dyes and pigments.

2. A masking film according to claim 1, wherein the cellulose ester component (a) is selected from cellulose nitrate, cellulose acetate propionate, cellulose acetate butyrate and mixtures thereof.

3. A masking film according to claim 2, wherein the cellulose ester component (a) comprises cellulose nitrate containing 11.0% to 12.2% by weight of nitrogen and having a viscosity in the range from 0.25 to 0.5 second.

4. A masking film according to claim 2 or 3, wherein the cellulose ester component (a) comprises cellulose acetate propionate having about 2.5% acetylation and about 45% propionation.

5. A masking film according to claim 4, wherein the cellulose ester component (a) comprises a cellulose acetate propionate having a melting-point in the range from 185° C. to 210° C. and a viscosity in the range from 0.2 to 0.5 second.

6. A masking film according to claim 1 or 2, wherein the cellulose ester component (a) comprises cellulose acetate butyrate having about 13% acetylation and about 38% butylation.

7. A masking film according to claim 6, wherein the cellulose ester component (a) comprises cellulose acetate butyrate having a melting-point in the range from 155° C. to 165° C. and a viscosity in the range from 0.1 to 0.5 second.

8. A masking film according to claim 1, wherein the aliphatic polyester-based polyurethane (b) is present in an amount in the range from 30% to 80% by weight of the total resin mix.

9. A masking film according to claim 1, wherein the intermediate layer of adhesive comprises a synethetic resin adhesive or a natural rubber adhesive.

10. A masking film according to claim 9, wherein an α-terpene resin is included as a tackifier in the adhesive layer.

* * * * *